United States Patent
Strack

[19]

[11] Patent Number: 6,063,684

[45] Date of Patent: May 16, 2000

[54] METHOD FOR ELIMINATING RESIDUAL OXYGEN CONTAMINATIONS FROM CRUCIBLE-DRAWN SILICON WAFERS

[75] Inventor: Helmut Strack, Munich, Germany

[73] Assignee: Siemens Aktiengesellschaft, Munich, Germany

[21] Appl. No.: 09/146,967

[22] Filed: Sep. 4, 1998

[30] Foreign Application Priority Data

Sep. 17, 1997 [DE] Germany .......................... 197 40 905

[51] Int. Cl.[7] .................................................. H01C 21/76
[52] U.S. Cl. .......................... 438/400; 438/478; 438/584; 438/689
[58] Field of Search .................................... 438/471, 478, 438/400, 584, 689, 784

[56] References Cited

U.S. PATENT DOCUMENTS 4,589,952  5/1986  Behringer et al. .
5,250,449  10/1993  Kuroyanagi et al. .
5,355,831  10/1994  Schauer .
5,891,776  4/1999  Han et al. .

*Primary Examiner*—Kevin M. Picardat
*Assistant Examiner*—D. Mark Collins
*Attorney, Agent, or Firm*—Hill & Simpson

[57] ABSTRACT

In a method for eliminating residual oxygen contaminations from crucible-drawn silicon wafers, a number of trenches are etched into the front side of a crucible-drawn silicon wafer and that the silicon wafer is subsequently tempered at approximately 1100° C. As a result of the extremely large surface area in the front side of the silicon wafer, oxygen contaminants can effectively diffuse out. After the oxygen drive-out has ensued, the trenches are filled bubble-free with epitaxially deposited silicon and the active structures are processed into the front side.

9 Claims, 1 Drawing Sheet

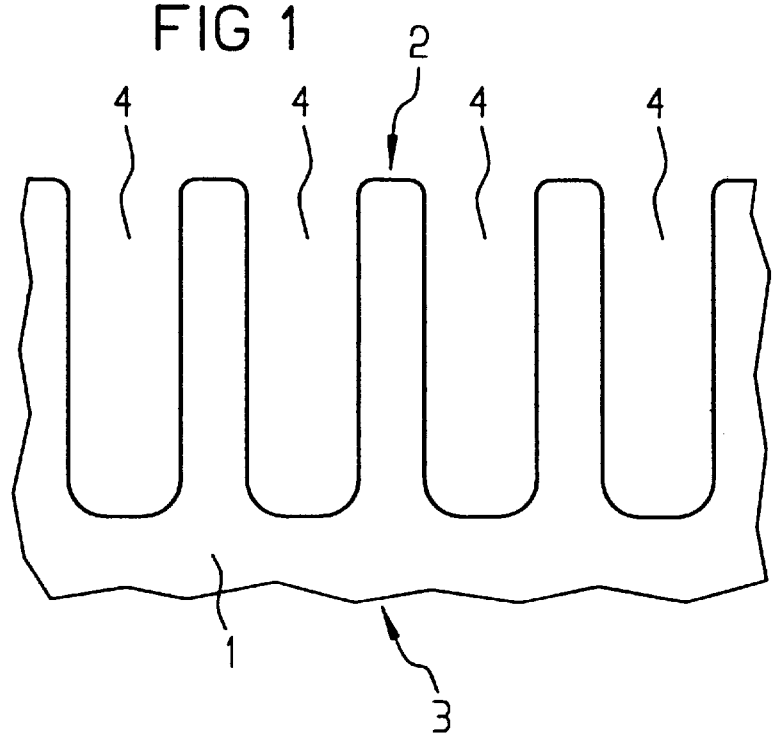
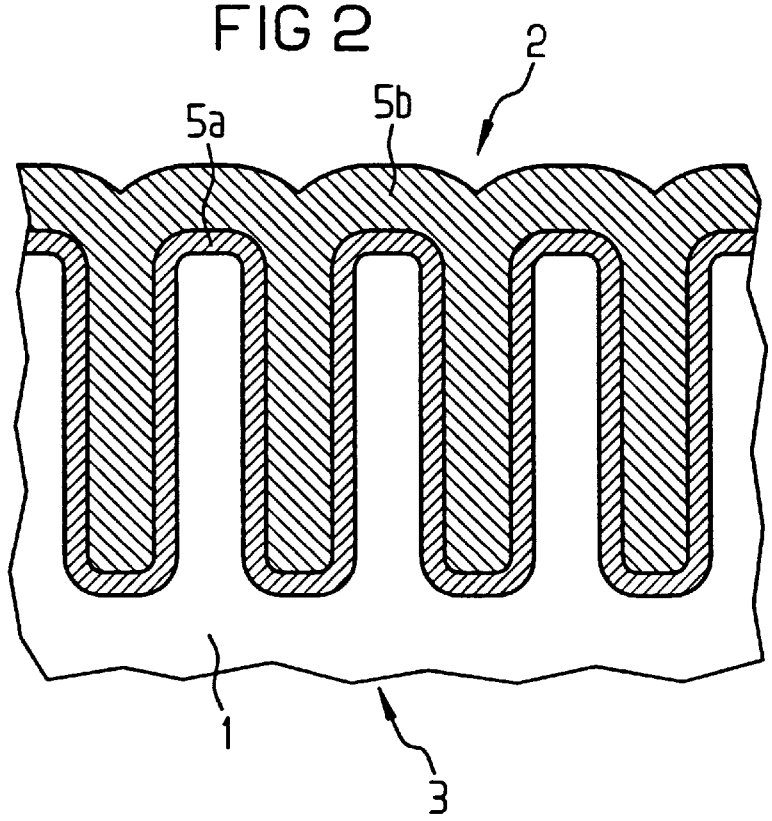

METHOD FOR ELIMINATING RESIDUAL OXYGEN CONTAMINATIONS FROM CRUCIBLE-DRAWN SILICON WAFERS

BACKGROUND OF THE INVENTION

1. Field of the Invention

The present invention is directed to a method for eliminating residual oxygen contaminations from crucible-drawn silicon wafers.

2. Description of the Prior Art

The employment of zone-drawn silicon for manufacturing active components is well-known. It has been shown for active power semiconductor components in vertical format, however, that the employment of zone-drawn silicon has limits in mass production, since wafers only having a diameter≦150 mm are made.

It is also known to employ wafers known as silicon epitaxy wafers. Such silicon epitaxy wafers are highly doped silicon wafers on which a lightly doped epitaxial silicon layer is applied. If such wafers are to be used in a power semiconductor component, the thickness of this epitaxial layer must be increased as the blocking voltage increases for which the power semiconductor component is designed.

Further, wafers known as crucible-drawn silicon wafers are known, i.e. silicon wafers drawn according to the Czochralsky method. The employment of these crucible-drawn wafers would be economically desirable since wafers having extremely large diameters can be manufactured with this method. Such wafers, however, were hitherto not capable of being utilized in many applications, particularly given vertical power semiconductor components, since crucible-drawn silicon wafers exhibit doping fluctuations ("striations") and imperfections due to incorporated carbon and oxygen contaminants that degrade the component properties.

Crystal-drying from the melt according to Czochralsky is a well-known method for manufacturing single-crystals. Relatively large single-crystals can be manufactured with a suitably oriented inoculation crystal that is brought briefly into contact with the melting surface and is then slowly in turn drawn upwardly, i.e. slower than 1 mm/min. A rotational movement of the inoculation crystal, for example 20 revolutions per minute, insures a uniform crystallization and likewise causes a uniform incorporation of dopants added to the melt.

The temperature profile at the boundary between the melt and the solid crystal is important for growing the crystal in a mechanically stress-free manner as well as for the homogeneity of a doping perpendicular to the direction. Given a non-planar surface of constant temperature, ring structures ("striations") having microscopic doping fluctuations occur, which are extremely disturbing particularly for employment in vertical power semiconductor components.

The selection of the crucible material is critical in the case of silicon. Quartz and graphite, graphite provided with a hard graphite surface layer (shiny coal) as well as boron nitride are suitable.

The high melting temperature of 1415° C. means that contaminates from the crucible material enter into the melt.

The two principal residual contaminants of crucible-drawn silicon single-crystals are slight quantities of oxygen and carbon (approximately 0.02 ppm). The occurring carbon contaminants that arise from the crucible material are usually not critical since the carbon does not have a doping effect in silicon. The oxygen contaminants, however, are problematical.

The oxygen contaminants in crucible-drawn silicon have long been utilized for "intrinsic" gettering. The silicon wafers are for this purpose subjected to a tempering cycle in order to generate an imperfection-free, surface-proximate zone. This tempering cycle is composed of a first high-temperature step at approximately 1100° C. followed by a low-temperature step at approximately 650° C. and a second high-temperature step at approximately 1000° C.

This tempering cycle, which is also called "denuding process" is thereby highly dependent on the initial oxygen and carbon concentration in the silicon.

The first high-temperature step dissolves the existing oxygen dispersions and thus enables the drive-out (expulsion) of the oxygen from the surfaces of the silicon wafer. In the following, second low-temperature step, nucleation sites are generated in the volume of the silicon wafer, i.e., thus under the "denuded zone". During the subsequent high-temperature step dispersions that serve as getter centers for oxygen, heavy metals and other imperfections during the manufacturing process grow at these nucleation sites.

The usable active zone, referred to as the "denuded zone" in this method, is only a few micrometers deep, so that this is not suitable for the employment of silicon wafer manufacture treated in this way for active, vertical power semiconductor components whose space charge zones extend approximately 100 micrometers or even deeper into the volume of the silicon wafer.

SUMMARY OF THE INVENTION

It is therefore an object of the present invention is to provide a more efficient method for the elimination of residual oxygen contaminants from crucible-drawn silicon wafers that makes these suitable, in particular, for employment for manufacturing highly inhibiting (blocking) vertical power semiconductor components.

This object is inventively achieved by a method of the species initially cited that includes the following steps:

a) preparing a silicon wafer with a front side and a back side;
b) etching a number of trenches into the front side of the silicon wafer;
c) heating the silicon wafer to a temperature of approximately 1100° C. in a vacuum or a protective gas atmosphere, and, subsequently;
d) filling the trenches with epitaxially deposited silicon.

As a result of this method, the oxygen dispersions in the inside of the silicon wafer are dissolved and can effectively diffuse out through the surface of the silicon wafer that has been greatly enlarged due to the trenches.

Typically, the trenches are etched into the front side of the silicon wafer to a depth that approximately corresponds to the space charge zone depth of the active, vertical power semiconductor components to be produced later.

After heating the silicon wafer to the temperature of approximately 1100° C., the etched trench structure in the silicon wafer front side is typically over-etched again in order to reproduce the exact trench contours, that may have been deteriorated by the tempering step.

In a further embodiment, the trench structure is over-etched not only following the heating of the silicon wafer to a temperature of approximately 1100° C. but also the silicon wafer is again heated to a temperature of approximately 1100° C. following the over-etching in order to effect the drive-out of the oxygen dispersions, and thereafter the trench structure can be over-etched again. In general, the over-etching and tempering of the silicon wafer can be multiply conducted.

The trenches are preferably filled with silicon over the course of a number of successive epitaxy steps in order to assure a void-free filling. All methods known from DRAM technology can be used.

For specific applications, the trenches can be only partially filled and, for example, closed (covered) with an oxide layer.

In one embodiment of the present invention, the silicon wafer and the epitaxially deposited silicon exhibit the same conductivity type.

In an alternative embodiment, the silicon wafer and the epitaxially deposited silicon exhibit the opposite conductivity type. As a result of this procedure, inner zones that are constructed of p-zones and n-zones in alternation can be offered for active, vertical power semiconductor components, particularly for power transistors and IGBTs, and these alternating zones can be mutually cleared in the blocking mode of the power semiconductor component, so that a very high blocking voltage can be achieved. In the transmissive mode, an excellent conductivity is assured due to the alternating zones.

In a further version of this alternative embodiment, a high-impedance silicon wafer is employed, i.e. a silicon wafer that does not exhibit any doping or only a very slight doping, and the epitaxially deposited silicon exhibits dopants of the first and the second conductivity types in approximately equal quantities. The diffusion coefficients of the two dopants thereby differ clearly from one another. After the deposition and the filling of the trenches, the silicon wafer is then subjected to a tempering step wherein the two differently diffusing dopants diffuse into the silicon wafer and zones of opposite conductivity type form at the trench edges. The advantages and functioning of the structures that have arisen in this way are identical to those of the structures discussed in the preceding paragraph.

DESCRIPTION OF THE DRAWINGS

FIG. 1 is a section through a portion of a crucible-drawn silicon wafer with etched-in trenches in an initial stage of the inventive method.

FIG. 2 is a section through the silicon wafer of FIG. 1 after the filling of the trenches has ensued in a subsequent stage of the inventive method.

DESCRIPTION OF THE PREFERRED EMBODIMENTS

As can be seen from FIG. 1, a silicon wafer 1 is prepared in the method of the present invention, that has a front side 2 and a back side 3.

The illustrated silicon wafer was drawn from the melt with the process named for Czochralsky. In detail, a (111) inoculation crystal was employed, this being brought briefly into contact with the melt surface and then being drawn out slowly upwardly. The melt and the inoculation crystal had dopants of the n-type added thereto, arsenic in the present case.

The illustrated silicon wafer 1 was then sawn from the silicon rod drawn in this way.

A number of trenches 4 were subsequently wet-chemically etched into the front side 2 of the silicon wafer 1. The wet-chemical etching was significantly promoted by the use of a crystal with a (111) orientation since the etching of deep trenches and, in particular, the etching rate is highly promoted as a result, compared to a (100) orientation.

After the etching these trenches, the silicon wafer 1 was heated to a temperature of approximately 1100° C. in a furnace in a protective gas atmosphere. Due to the trenches 4, the surface area of the silicon wafer 1 is extremely large at the front side 2, so that the oxygen dispersions located in the inside of the silicon wafer 1 dissolve during this high-temperature step and can diffuse out.

After the drive-out of the oxygen contaminant has ensued, an over-etching of the trenches 4 introduced into the front side 2 of the silicon wafer 1 ensued in order to precisely restore the trench contours and to eliminate contaminants which may be present on the surface.

A first epitaxial deposition of a silicon layer 5a subsequently ensues, which can be seen in FIG. 2. In the illustrated exemplary embodiment, this applied epitaxial layer has a p-doping. Boron was selected as the p-dopant in the illustrated exemplary embodiment.

A second epitaxial deposition of a silicon layer 5b subsequently ensues. This epitaxial layer likewise has a boron doping.

A bubble-free filling of the trenches is assured on the basis of this double epitaxy. The alternating p-zones and n-zones arising in the front side 2 of the silicon wafer 1 serve the purpose of mutually clearing out each other during the blocking mode of a vertical power semiconductor component and of assuring a high blocking voltage. In the transmissive mode, these alternating zones assure an excellent conductivity.

The spacing of the trenches 4 can be selected between 1 micrometer and approximately 10 micrometers. The diameter of the trenches 4 typically amounts to between 1 micrometer and 5 micrometers.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for eliminating residual oxygen contaminants from crucible-drawn silicon wafers, comprising the steps of:

(a) crucible-drawing a silicon crystal and preparing a silicon wafer, having a front side and a back side, from the crucible-drawn silicon crystal, said silicon wafer containing oxygen contaminants;

(b) etching a plurality of trenches into said front side of said silicon wafer;

(c) heating said silicon wafer to a temperature of approximately 1100° C. in an atmosphere selected from the group consisting of a protective gas and a vacuum to drive out said oxygen contaminants to produce a silicon wafer usable to make highly blocking vertical power semiconductor components; and (d) filling said plurality of trenches with epitaxially deposited silicon.

2. A method as claimed in claim 1 wherein step (b) comprises over-etching said plurality of trenches.

3. A method as claimed in claim 2 comprising the additional step of, after over-etching said plurality of trenches, again heating said silicon wafer to a temperature of approximately 1100° C. in an atmosphere selected from the group consisting of a protective gas and a vacuum.

4. A method as claimed in claim 1 wherein step (d) comprises filling said trenches with epitaxially deposited silicon in a plurality of successive epitaxy steps.

5. A method as claimed in claim 1 wherein step (a) comprises preparing a silicon wafer to be used in manufacturing an active, vertical power semiconductor component.

6. A method as claimed in claim 5 wherein the active, vertical power semiconductor component to be made from said silicon wafer will have a space charge zone, and wherein step (b) comprises etching said plurality of trenches into said front side of said silicon wafer to a depth approximately equal to said space charge zone.

7. A method as claimed in claim 6 wherein step (a) comprises preparing a silicon wafer having a conductivity type, and wherein step (d) comprises filling said trenches with epitaxially deposited silicon having the same conductivity type as said silicon wafer.

8. A method as claimed in claim 6 wherein step (a) comprises preparing a silicon wafer having a conductivity type, and wherein step (d) comprises filling said trenches with epitaxially deposited silicon having a conductivity type opposite to said conductivity type of said silicon wafer.

9. A method as claimed in claim 6 wherein step (a) comprises preparing a high-impedance silicon wafer, wherein step (d) comprises filling said trenches with epitaxially deposited silicon containing dopants of a first conductivity type and a second conductivity type in approximately equal quantities, said dopants of said first conductivity type and said second conductivity type respectively having diffusion coefficients which are significantly different from each other, and said method comprising the additional step after step (d) of tempering said high-impedance silicon wafer for causing said dopants and said first conductivity type and said second conductivity type to differently diffuse into said high-impedance silicon wafer to produce respective zones of opposite conductivity types at edges of said plurality of trenches.

\* \* \* \* \*